United States Patent [19]

Easter et al.

[11] Patent Number: 5,366,924

[45] Date of Patent: Nov. 22, 1994

[54] METHOD OF MANUFACTURING AN INTEGRATED CIRCUIT INCLUDING PLANARIZING A WAFER

[75] Inventors: William G. Easter, Wernersville; Richard H. Shanaman, III, Myerstown, both of Pa.

[73] Assignee: AT&T Bell Laboratories, Murray Hill, N.J.

[21] Appl. No.: 852,442

[22] Filed: Mar. 16, 1992

[51] Int. Cl.⁵ .................................. H01L 21/302
[52] U.S. Cl. ................................ 437/63; 437/225; 437/235; 437/974; 148/DIG. 12; 156/645
[58] Field of Search ............... 437/63, 974, 225, 235, 437/241; 148/DIG. 12, DIG. 135; 156/645

[56] References Cited

U.S. PATENT DOCUMENTS

| | | | |
|---|---|---|---|
| 4,851,078 | 7/1989 | Short et al. | 156/645 |
| 4,878,957 | 11/1989 | Yamaguchi et al. | |
| 4,883,215 | 11/1989 | Goesele et al. | |
| 4,888,304 | 12/1989 | Nakagawa et al. | 437/974 |
| 4,962,056 | 10/1990 | Yamaki et al. | 437/974 |
| 4,973,563 | 11/1990 | Prigge et al. | 437/225 |
| 4,980,308 | 12/1990 | Hayashi et al. | 437/974 |
| 4,983,538 | 1/1991 | Gotou | 437/974 |
| 5,028,558 | 7/1991 | Haisma et al. | 437/974 |
| 5,032,544 | 7/1991 | Ito et al. | 148/DIG. 135 |
| 5,071,785 | 12/1991 | Nakazato et al. | 437/974 |
| 5,096,854 | 3/1992 | Saito et al. | 437/228 |
| 5,110,428 | 5/1992 | Prigge et al. | 156/657 |

FOREIGN PATENT DOCUMENTS

| | | | |
|---|---|---|---|
| 0352801 | 1/1990 | European Pat. Off. | 437/84 |
| 0464837 | 1/1992 | European Pat. Off. | 437/235 |
| 1215041 | 8/1989 | Japan | 148/DIG. 135 |
| 0465126 | 3/1992 | Japan | 437/235 |

OTHER PUBLICATIONS

"A Bonded-SOI-Wafer CMOS 16-Bit 50 KSPS Delta-Sigma ADC", *IEEE 1991 Custom Integrated Circuits Conference*, Takaramoto, Harajiri, Sawada, Kobayashi, Gotoh, pp. 18.1.1 through 18.1.4.

Primary Examiner—Tom Thomas
Assistant Examiner—Michael Trinh
Attorney, Agent, or Firm—Scott W. McLellan

[57] ABSTRACT

A process for planarizing a bonded wafer. The wafer has a layer of exposed oxide thereon which acts as a reference for the grinding and polishing of the wafer. The resulting ground and polished wafer has a thinned, substantially planar, working layer for subsequent fabrication of transistors, etc.

10 Claims, 1 Drawing Sheet

METHOD OF MANUFACTURING AN INTEGRATED CIRCUIT INCLUDING PLANARIZING A WAFER

BACKGROUND OF THE INVENTION

1. Field of the Invention

This invention relates to integrated circuit manufacturing generally and, more particularly, to a method of planarizing a semiconductor wafer prior to the formation of circuits thereon.

2. Description of the Prior Art

In dielectric isolated (DI) wafer fabrication, bonded wafers are becoming less expensive than wafers made by existing grow-handle-and-grind methods of DI wafer fabrication. However, bonded wafers in general may not be sufficiently flat for advanced integrated circuit manufacturing, e.g., submicron CMOS technology. There exists a need for an inexpensive process for planarizing bonded wafers, preferably using existing grinding/polishing equipment found in many chip manufacturing plants.

SUMMARY OF THE INVENTION

An aspect of the invention is a method of making an integrated circuit characterized by the steps of: forming an oxide layer (on each major surface of a handle wafer), bonding another wafer to the handle wafer (to form a bonded wafer having a working layer, a handle layer, and an exposed oxide layer, the working layer being insulated from a handle layer), and polishing both major surfaces of the bonded wafer to thin the working layer to a predetermined thickness using the exposed oxide layer as a planar reference. The result is a substantially planar dielectrically isolated wafer.

Another aspect of the invention is a method of making an integrated circuit, characterized by the steps of: forming an oxide layer (on at least one major surface of a semiconductor wafer) and polishing the wafer (on both major surfaces thereof) to a predetermined thickness using the oxide layer as a planar reference. The result is a substantially planar wafer. The layer of oxide remains after the polishing step.

BRIEF DESCRIPTION OF THE DRAWING

The foregoing features of this invention, as well as the invention itself, may be more fully understood from the following detailed description of the drawings, in which.

DETAILED DESCRIPTION

In FIGS. 1-4, an exemplary process of planarizing an exposed layer of a bonded wafer is shown. The bonded wafer 5 comprises a working layer 1, in which transistors, etc., will be later formed, and a handle wafer 2. According to one embodiment of the invention, the bonded wafer 5 has an oxide layer 4 which is used as a reference for planarizing the wafer 5. More particularly, the layer 4 serves as a planar reference during the grinding and polishing of the working layer 1 to a predetermined thickness.

Figure 1:
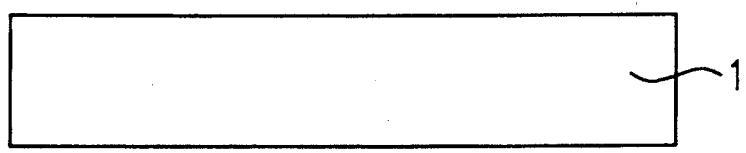
FIGS. 1-4 are illustrations (not to scale) showing the process of bonding and planarizing a working portion of a bonded wafer structure.
Figure 1:
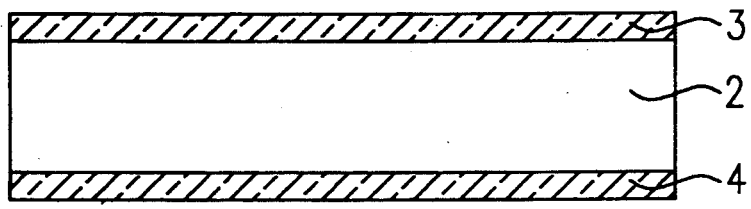
Figure 2:
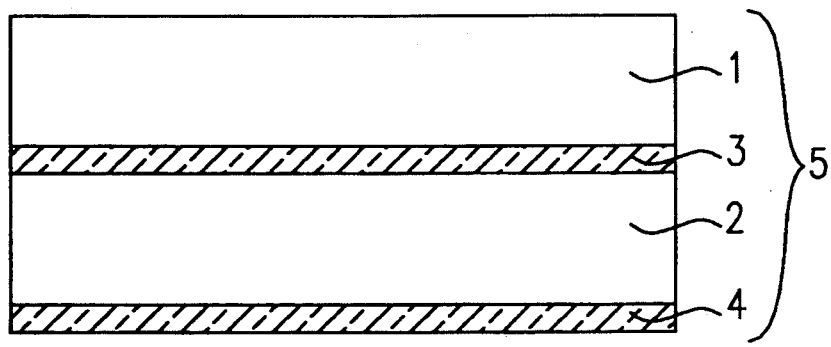

In FIG. 1, two wafers 1, 2 are shown which are to be bonded together. The wafers 1, 2, preferably silicon wafers, are first cleaned. Subsequently, the wafer 2 is preferably oxidized on both major surfaces thereof to form oxide layers 3, 4. The layers 3, 4 are formed by a conventional oxide forming process, such as placing wafer 2 in a heated atmosphere of oxygen and steam.

The wafers 1, 2 are bonded together by one of many well known processes, such as those shown in U.S. Pat. Nos. 4,878,957 or 4,883,215. The result is the dielectrically isolated (DI) bonded wafer 5, shown in FIG. 2. As shown, bonded wafer 5 has four layers: a working layer 1; an oxide layer 3 (insulating layer 1 from layer 2); a handle layer 2; and a second, exposed, oxide layer 4. It is noted that for this embodiment of the invention, oxide layer 3 is not required (layer 1 may be in direct contact with layer 2, or layers 1 and 2 may be the same layer). If a single layer is used, the oxide layer 4 is grown on one side or major surface of the layer, and the wafer is treated like DI wafer 5 in further processing.

Figure 3:
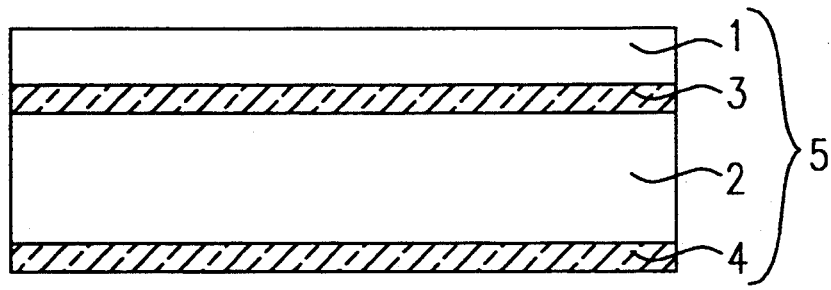

The bonded wafer 5 may then be ground such that the working layer 1 is thinned to a first predetermined thickness as shown in FIG. 3. The grinding process may be repeated as necessary to achieve the desired thickness and planarity. As will be explained in more detail below, the exposed oxide layer 4 operates as a planar reference for planarizing the working layer 1.

Figure 4:
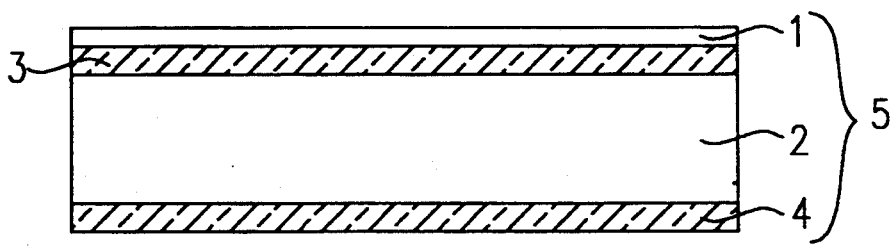

The bonded wafer 5 is then polished to the final thickness, as shown in FIG. 4. This step, which may be repeated as necessary, polishes both major surfaces of the wafer 5 to thin the working layer 1 to a second predetermined thickness. The polishing process utilizes a slurry which preferentially etches the exposed surface of the working layer 1 relative to the oxide layer 4. As will be discussed below, layer 4 serves as a reference layer for controlling the planarity of layer 1 during the polishing process. This results in a thin working layer 1 having good planarity over the surface of the bonded wafer 5.

The exposed oxide layer 4 may be later removed to facilitate bonding of finished chips into packages.

As stated above, the planarity of the wafer 5 during grinding and polishing is substantially determined by the oxide layer 4. As understood, the oxide layer 4, being "harder" than the silicon layers 1, 2, maintains its planarity better than silicon under grinding and polishing. Thus, the oxide layer 4 serves as a planar reference such that the exposed major surface of working layer 1 is maintained substantially planar, in reference to oxide layer 4, during grinding and polishing.

EXEMPLARY RESULTS

Starting with a 3 inch bonded wafer with approximately 1000 micron thick layers 1, 2 and oxide layers of approximately 1.7 micron thick, the wafer is ground in an MPS-T500 plunge grinder, made by GMN of Germany, using deionized water as a lubricant. The grinding step is done twice, until the thickness of layer 1 is about 25 microns. Then the wafer is polished in a PR Hoffman double sided polisher, model PR-1-66T, using about 2 PSI plate pressure, a plate rotation speed of about 35 RPM, and a slurry of 2354 Nalco colloidal silica and de-ionized water as a lubricant. The colloidal silica acts as a silicon-over-silicon dioxide selective etchant. The result is a polished, dielectrically isolated wafer with a layer 1 thickness of 5 microns and a planarity variation of less than 0.3 microns over the wafer.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. A method of making an integrated circuit, CHARACTERIZED BY THE STEPS OF:
   forming on first and second major surfaces of a handle wafer corresponding first and second oxide layers;
   bonding a working wafer to the handle wafer to form a bonded wafer, wherein the working wafer, handle wafer and first and second oxide layers become in the bonded wafer a working layer, a handle layer, the first oxide layer between the working layer and the handle layer, and the second oxide layer being an exposed oxide layer, respectively; and
   polishing both major surfaces of the bonded wafer to thin the working layer to a specified thickness using the second oxide layer as a planar reference so as to form a substantially planar wafer;
   wherein the second oxide layer remains after the polishing step.

2. The method of making an integrated circuit as recited in claim 1, further characterized by the step of:
   grinding the bonded wafer to a specified thickness prior to the polishing thereof.

3. The method of making an integrated circuit as recited in claim 2, wherein the polishing step uses an etchant that selectively removes the material of the working layer relative to the second oxide layer.

4. The method of making an integrated circuit as recited in claim 3, further characterized by the step of:
   removing the second oxide layer after polishing.

5. The method of making an integrated circuit as recited in claim 4, wherein the working layer and the handle layer are comprised of silicon.

6. A method of making an integrated circuit on an semiconductor wafer having first and second major surfaces, a working layer, a handle layer, a first oxide layer disposed between the working and handle layers, the working layer and the handle layer forming the first and second major surfaces of the wafer, respectively; CHARACTERIZED BY THE STEPS OF:
   forming a second oxide layer on the second major surface of the semiconductor wafer; and
   polishing the wafer, on both major surfaces thereof, to a specified thickness using the second oxide layer as a planar reference, to form a substantially planar wafer;
   wherein the second oxide layer remains after the polishing step.

7. The method of making an integrated circuit as recited in claim 6, further characterized by the step of:
   grinding the wafer to a specified thickness prior to the polishing step.

8. The method of making an integrated circuit as recited in claim 7, wherein the polishing step uses an etchant that selectively removes the material of the working layer relative to the second oxide layer.

9. The method of making an integrated circuit as recited in claim 8, further characterized by the step of:
   removing the polished second oxide layer on the wafer.

10. The method of making an integrated circuit as recited in claim 9, wherein the working layer and the handle layer are comprised of silicon.

* * * * *